US010361706B2

(12) United States Patent
Chattopadhyay et al.

(10) Patent No.: US 10,361,706 B2
(45) Date of Patent: Jul. 23, 2019

(54) CLOCK AND DATA RECOVERY (CDR) CIRCUIT

(71) Applicant: Synopsys, Inc., Mountain View, CA (US)

(72) Inventors: Biman Chattopadhyay, Karnataka (IN); Jairaj Naik K R, Karnataka (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/901,212

(22) Filed: Feb. 21, 2018

(65) Prior Publication Data

US 2019/0181868 A1    Jun. 13, 2019

(30) Foreign Application Priority Data

Dec. 12, 2017    (IN) .............................. 201741044595

(51) Int. Cl.
  *H03L 7/08*      (2006.01)
  *H04L 7/00*      (2006.01)
  *H03L 7/089*     (2006.01)

(52) U.S. Cl.
  CPC .......... *H03L 7/0802* (2013.01); *H03L 7/0807* (2013.01); *H03L 7/0895* (2013.01); *H04L 7/0008* (2013.01)

(58) Field of Classification Search
  CPC ... H03L 7/0802; H03L 7/0807; H03L 7/0895; H04L 7/0008
  See application file for complete search history.

(56) References Cited

U.S. PATENT DOCUMENTS

| 6,075,406 | A  | * | 6/2000 | Lee ....................... H03L 7/0896 307/110 |
| 7,580,497 | B2 |   | 8/2009 | Wang et al. |
| 7,692,501 | B2 |   | 4/2010 | Hsueh et al. |
| 8,687,756 | B2 | * | 4/2014 | Sindalovsky ........... H03L 7/087 331/25 |

(Continued)

OTHER PUBLICATIONS

Kim et al. "A fully Integrated 0.13-μm CMOS 40-GB/s Serial Link Transceiver", May 1 2009, IEEE Journal of Solid-State circuits, vol. 44, No. 5, pp. 1510-1521.*

(Continued)

*Primary Examiner* — Sophia Vlahos
(74) *Attorney, Agent, or Firm* — Fenwick & West LLP

(57) ABSTRACT

A clock and data recovery (CDR) circuit for data sampling includes a sampler, a phase detector, a proportional-integral (PI) controller, and an oscillator. The sampler receives a data signal and a clock signal, and generates first, second, and third sampled signals. The phase detector receives the first, second, and third sampled signals, and generates first and second early-late vote (ELV) signals. The charge pump steers a current signal into or out of one of summing nodes based on the first and second ELV signals. The integrator circuit receives the current signal from one of the summing nodes, and generates a first control signal. The proportional circuit receives the first and second ELV signals, and generates a second control signal. The oscillator receives the first and second control signals from the integrator and proportional circuits, respectively, and generates a clock signal for sampling the data.

7 Claims, 5 Drawing Sheets

(56) References Cited

U.S. PATENT DOCUMENTS

| | | | |
|---|---|---|---|
| 8,879,618 B2* | 11/2014 | Abdalla | H04L 25/0272 |
| | | | 375/233 |
| 9,106,370 B1* | 8/2015 | Srinivasa | H03L 7/089 |
| 2009/0110136 A1* | 4/2009 | Badalone | H03D 13/004 |
| | | | 375/376 |
| 2011/0194660 A1* | 8/2011 | Kenney | H03L 7/0807 |
| | | | 375/355 |
| 2012/0257693 A1* | 10/2012 | Sindalovsky | H04L 7/033 |
| | | | 375/340 |

OTHER PUBLICATIONS

Yang et al. "A Fully Differential Charge Pump with Accurate Current Matching and Rail-to-Rail Common-Mode Feedback Circuit", 2008, pp. 448-451, IEEE.*

Rhee et al. "A Uniform Bandwidth PLL Using a Continuously Tunable Single-Input Dual-Path LC VCO for 5Gb/s PCI Express Gen2 Application", Nov. 2007, pp. 63-66, IEEE Asian Solid-State Circuits Conference.*

Shoujun Wang et al., "Design Considerations for 2nd-Order and 3rd-Order Bang-Bang CDR Loops," Proceedings of the IEEE 2005 Custom Integrated Circuits Conference, 2005, San Jose, CA, 2005, pp. 317-320.

\* cited by examiner

CLOCK AND DATA RECOVERY (CDR) CIRCUIT

CROSS-RELATED APPLICATIONS

This application claims priority of Indian Application Serial No. 201741044595, filed Dec. 12, 2017, the contents of which are incorporated herein by reference.

FIELD OF THE INVENTION

The present invention relates to the field of integrated circuits, and more particularly, to a clock and data recovery (CDR) circuit.

BACKGROUND

A data communication system generally receives a data signal without an accompanying clock signal. Hence, a CDR circuit is used in the data communication system to generate the clock signal that is phase and frequency synchronized with the data signal. The CDR circuit may be implemented either with an open-loop architecture or a closed loop architecture.

A CDR circuit typically includes a phase detector, an oscillator, and a data sampler. The phase detector determines a phase difference between a phase of the clock signal and a phase of the data signal, and generates a frequency control signal based on the phase difference. The oscillator receives the frequency control signal, and generates an oscillator output. The oscillator further recovers the clock signal from the oscillator output. The data sampler receives the clock signal, and samples the data signal based on the clock signal.

Variations or ripples in the frequency control signal may cause jitter in the oscillator output, thereby, causing errors in the clock recovery, which in turn results in data read-out errors from the data signal. To control such variations or ripples, conventional CDR circuits include a charge pump and a loop filter circuit, i.e., a proportional-integral (PI) controller. The implementation of the PI controller in the CDR circuit includes combining integral and proportional paths that require components such as capacitors, and gating and flip flop circuits. Due to the aforementioned components, such CDR circuit consume substantial power at high frequencies.

The conventional CDR circuits further include on-chip resistive-capacitive (RC) filters to filter out high frequencies. While implementing the on-chip RC filters in the CDR circuits, designers have to deal with $3^{rd}$ order loops, and hence, the design of the CDR circuits become complicated due to the frequency dependent $3^{rd}$ order loop behaviour. Additionally, the CDR circuits may require an off-chip capacitor to maintain the stability of the loop, thus increasing design complexity of the CDR circuits.

In light of the foregoing, it would be advantageous to have a CDR circuit that will consume less power at a high frequency, maintain loop stability, provide requisite current matching characteristics, ensure reduced leakage to provide an accurate clock signal for data sampling, and overcomes the aforementioned drawbacks.

SUMMARY

In an embodiment of the present invention, a clock and data recovery (CDR) circuit is provided. The CDR circuit includes a sampler, a phase detector, a proportional-integral (PI) controller, and an oscillator. The sampler receives data and clock signals, and generates first, second, and third sampled signals. The phase detector is connected to the sampler for receiving the first, second, and third sampled signals, and generates first and second early-late vote (ELV) signals. The PI controller is connected to the phase detector, and comprises a charge pump, an integrator circuit, and a proportional circuit. The charge pump receives the first and second ELV signals, and steers a current signal into or out of one of summing nodes based on the first and second ELV signals. The integrator circuit receives the current signal from one of the summing nodes, and generates a first control signal. The proportional circuit receives the first and second ELV signals, and generates a second control signal. The oscillator is connected to the integrator and proportional circuits for receiving the first and second control signals, respectively, and generates the clock signal.

Various embodiments of the present invention provide a clock and data recovery (CDR) circuit for generating a clock signal. The CDR circuit includes a sampler, a phase detector, a proportional-integral (PI) controller, an oscillator, and a common-mode feedback (CMFB) amplifier circuit. The sampler receives data and clock signals, and generates first, second, and third sampled signals that are provided to the phase detector. The phase detector generates first and second early-late vote (ELV) signals. The PI controller comprises a charge pump, an integrator circuit, and a proportional circuit. The charge pump receives the first and second ELV signals, and steers a current signal into or out of one of summing nodes based on the first and second ELV signals. The integrator circuit receives the current signal from one of the summing nodes, and generates a first control signal. The proportional circuit receives the first and second ELV signals, and generates a second control signal. The oscillator is connected to the integrator and proportional circuits for receiving the first and second control signals, respectively, and generates the clock signal.

The CMFB amplifier circuit is connected to the charge pump and a reference voltage source, for receiving the first control signal and a reference voltage signal, respectively, and generates a CMFB control signal. The charge pump comprises a current-source circuit for receiving the CMFB control signal from the CMFB amplifier circuit, and generates the current signal. The charge pump further includes first through fourth differential pair of switches such that the first and second differential pair of switches share first and second summing nodes with the third and fourth differential pair of switches, respectively. The first and third differential pair of switches receive the first and second ELV signals, respectively, and the second and fourth differential pair of switches receive complementary versions of the first and second ELV signals, respectively. The first through fourth differential pair of switches are turned ON or turned OFF based on the first and second ELV signals. The CDR circuit further comprises a resistive-capacitive (RC) circuit that is connected to the current-source circuit, and provides a stability of a CMFB loop when the CMFB amplifier circuit is connected to the current-source circuit. The CMFB amplifier circuit comprises a source degenerated pair of switches including first through fourth switches to control frequency variations in the clock signal. The first and second switches are connected to the reference voltage source and the third and fourth switches are connected to the summing nodes.

The integrator circuit includes a capacitor bank that is connected to the summing nodes. The capacitor bank includes a plurality of capacitors including at least first through third capacitors that are connected in a combination such that the third capacitor is connected across first and second summing nodes of the summing nodes. Further, the first and second capacitors are connected between the first and second summing nodes and a power supply, respectively. Further, a first capacitance of the first capacitor is equal to a second capacitance of the second capacitor. In this way, separate proportional and integral paths are realized in the CDR circuit, which reduces the requirement of additional gates and flip flops circuits, and thus, minimizes power consumption at high frequencies. Further, to reduce the common mode induced frequency variations at the oscillator output, a source degenerated amplifier with four input pairs is used as the CMFB amplifier circuit. Further, the CMFB amplifier circuit is enabled to work in a linear operating region with high input voltage swings by using a source degenerated pair of switches at its input terminals.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

As used in the specification and claims, the singular forms "a", "an" and "the" include plural references unless the context clearly dictates otherwise. For example, the term "an article" may include a plurality of articles unless the context clearly dictates otherwise.

Those with ordinary skill in the art will appreciate that the elements in the figures are illustrated for simplicity and clarity and are not necessarily drawn to scale. For example, the dimensions of some of the elements in the figures may be exaggerated, relative to other elements, in order to improve the understanding of the present invention.

There may be additional components described in the foregoing application that are not depicted on one of the described drawings. In the event such a component is described, but not depicted in a drawing, the absence of such a drawing should not be considered as an omission of such design from the specification.

Before describing the present invention in detail, it should be observed that the present invention utilizes a combination of components which constitutes a clock and data recovery (CDR) circuit for generating a clock signal for data sampling. Accordingly, the components and the method steps have been represented, showing only specific details that are pertinent for an understanding of the present invention so as not to obscure the disclosure with details that will be readily apparent to those with ordinary skill in the art having the benefit of the description herein.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

Figure 1:
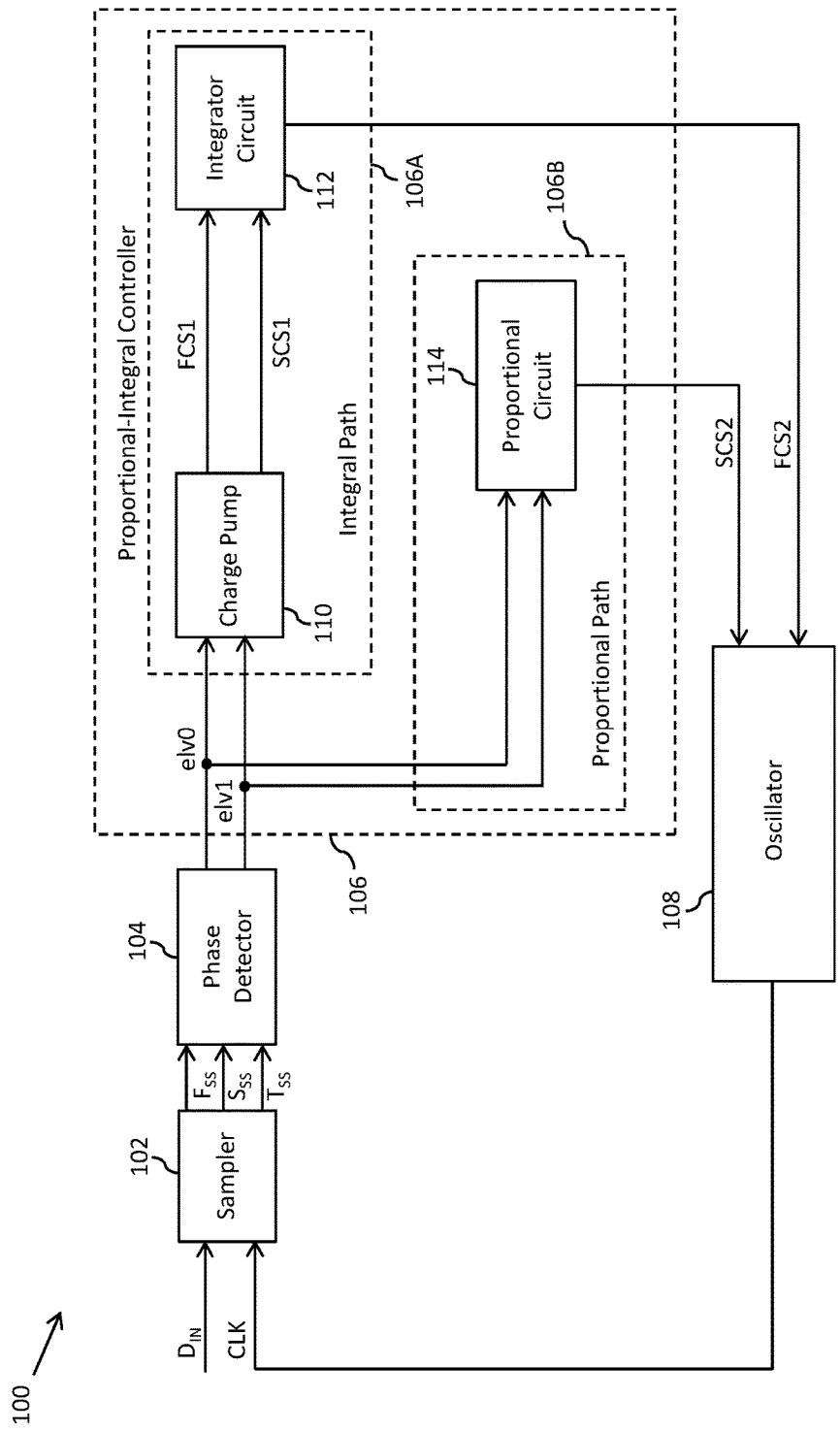
FIG. 1 is a schematic block diagram of a clock and data recovery (CDR) circuit, in accordance with an embodiment of the present invention.

Referring now to FIG. 1, a block diagram of a clock and data recovery (CDR) circuit 100 in accordance with an embodiment of the present invention is shown. The CDR circuit 100 is used in a data communication channel (not shown) that communicates digital data, for example, a data signal $D_{IN}$ between at least two computing devices (not shown). Generally, the CDR circuit 100 is implemented at a receiver end of the data communication channel to receive the data signal $D_{IN}$ from a transmitter (not shown) of the data communication channel, and generate timing information, such as a clock signal CLK, for sampling the received data signal $D_{IN}$. The CDR circuit 100 includes a sampler 102, a phase detector 104, a proportional-integral (PI) controller 106, and an oscillator 108. The PI controller 106 has separate integral and proportional paths 106A and 106B. The integral path 106A includes a charge pump 110 and an integrator circuit 112. The proportional path 106B includes a proportional circuit 114.

The sampler 102 receives the data signal $D_{IN}$ and the clock signal CLK. The sampler 102 samples the data signal $D_{IN}$ based on the clock signal CLK, and generates first, second, and third sampled signals $F_{SS}$, $S_{SS}$, and $T_{SS}$. For example, the sampler 102 samples the data signal $D_{IN}$ based on the clock signal CLK (for example, the clock signal CLK with "0" degree phase), and generates the first and second sampled signals $F_{SS}$ and $S_{SS}$. The sampler 102 further samples the first and second sampled signals $F_{SS}$ and $S_{SS}$ using the clock signal CLK (for example, the clock signal CLK with "180" degree phase) to generate the third sampled signal $T_{SS}$.

The phase detector 104 is connected to the sampler 102 for receiving the first, second, and third sampled signals $F_{SS}$, $S_{SS}$, and $T_{SS}$. The phase detector 104 generates first and second early-late vote (ELV) signals elv0 and elv1. In an exemplary embodiment, the phase detector 104 performs an Exclusive-OR (EX-OR) operation between the first and third sampled signals $F_{SS}$ and $T_{SS}$, and generates the first ELV signal elv0. Similarly, the phase detector 104 performs an EX-OR operation between the second and third sampled signals $S_{SS}$ and $T_{SS}$, and generates the second ELV signal elv1. Each of the first and second ELV signals elv0 and elv1 is a digital signal having a logic low state (i.e., "0") or a logic high state (i.e., "1").

The PI controller 106 is connected to the phase detector 104. The integral and proportional paths 106A and 106B receive the first and second ELV signals elv0 and elv1. The integral path 106A has been described in conjunction with FIG. 2.

The charge pump 110 is connected to the phase detector 104 for receiving the first and second ELV signals elv0 and elv1. The charge pump 110 generates first and second current signals FCS1 and SCS1.

The integrator circuit 112 is connected to the charge pump 110 for receiving one of the first and second current signals FCS1 and SCS1. The integrator circuit 112 includes a plurality of capacitors (not shown). When a portion of one of the first and second current signals FCS1 and SCS1 is steered through one of the plurality of capacitors, the integrator circuit 112 generates a linearly varying differential output voltage signal. The linearly varying differential output voltage signal is referred to as a first control signal FCS2.

The proportional circuit 114 is connected to the phase detector 104 for receiving the first and second ELV signals elv0 and elv1. The proportional circuit 114 includes a plurality of resistors (not shown). The proportional circuit 114 generates a second control signal SCS2 based on the first and second ELV signals elv0 and elv1.

The oscillator 108 is connected to the integrator and proportional circuits 112 and 114 for receiving the first and second control signals FCS2 and SCS2, respectively. The oscillator 108 is a voltage-controlled oscillator (VCO). The VCO may be a low-frequency or high-frequency VCO. The oscillator 108 generates the clock signal CLK, and adjusts a frequency of the clock signal CLK based on a frequency of each of the first and second control signals FCS2 and SCS2. The oscillator 108 further provides the clock signal CLK to the sampler 102 for sampling the data signal $D_{IN}$.

Figure 2:
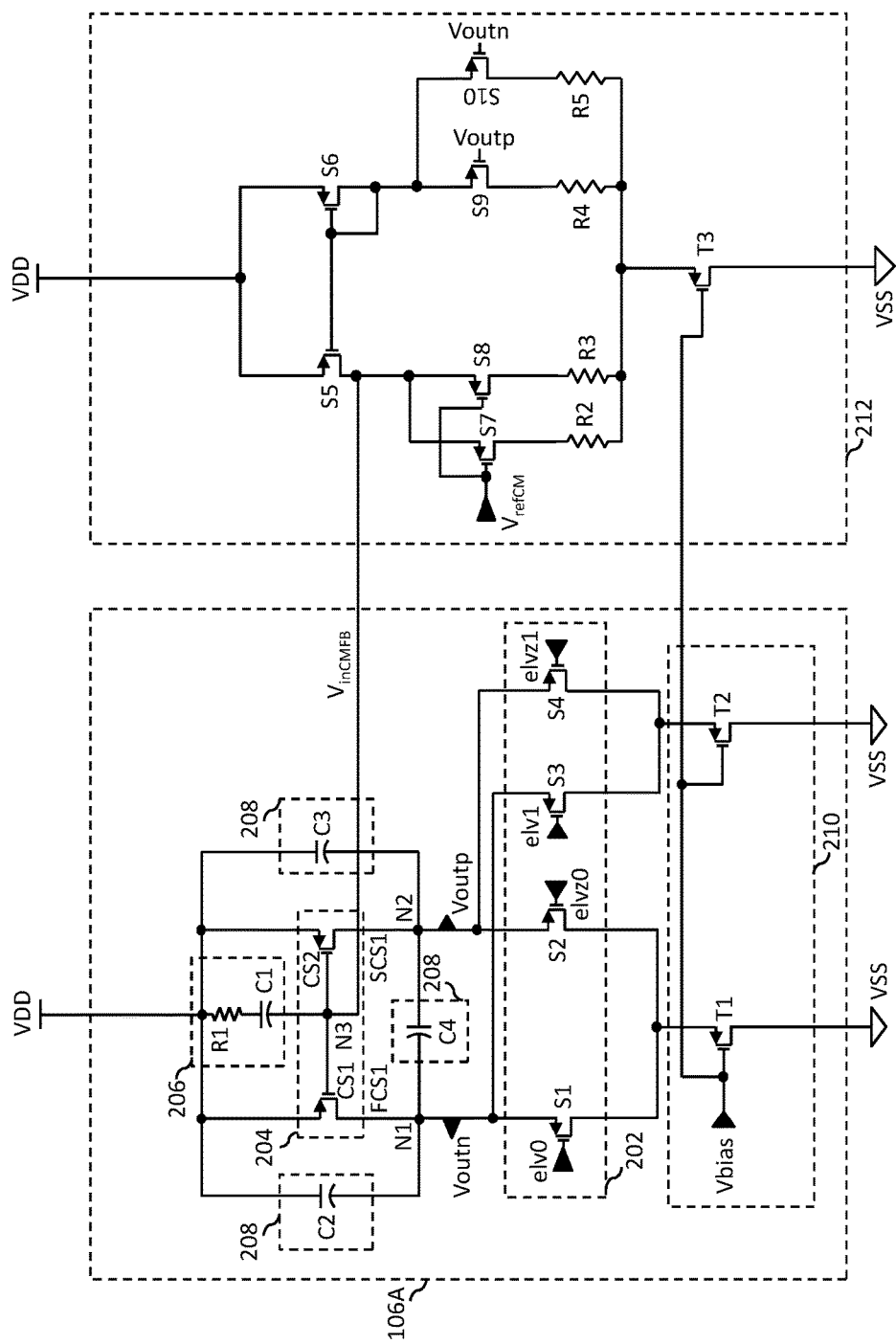
FIG. 2 is a circuit diagram of an integral path of the CDR circuit of FIG. 1, in accordance with an embodiment of the present invention.

Referring now to FIG. 2, a circuit diagram of the integral path 106A of the CDR circuit 100 of FIG. 1 in accordance with an embodiment of the present invention is shown. The integral path 106A includes a set of switches 202, a first current-source circuit 204, a first resistive-capacitive (RC) circuit 206, a capacitor bank 208, and a pair of transistors 210. In an exemplary embodiment, the charge pump 110 of FIG. 1 includes at least the set of switches 202 and the first current-source circuit 204. Further, the integrator circuit 112 of FIG. 1 includes at least the capacitor bank 208 and the summing nodes, such as first and second summing nodes N1 and N2. The first current-source circuit 204 is connected to a first common-mode feedback (CMFB) amplifier circuit 212. The first CMFB amplifier circuit 212 is connected to an input node of the first current-source circuit 204, for example, a third node N3, as shown.

The set of switches 202 is connected to the phase detector 104 for receiving the first and second ELV signals elv0 and elv1. The set of switches 202 further receives complementary versions of the first and second ELV signals elvz0 and elvz1. Hereinafter, the complimentary versions of the first and second ELV signals elvz0 and elvz1 are referred to as "first and second complementary ELV signals elvz0 and elvz1", respectively. In an embodiment, the phase detector 104 may generate the first and second complementary ELV signals elvz0 and elvz1 based on the first and second ELV signals elv0 and elv1. In another embodiment, a complementary circuit (not shown) may be connected to the phase detector 104 for receiving the first and second ELV signals elv0 and elv1. The complementary circuit further generates the first and second complementary ELV signals elvz0 and elvz1.

The set of switches 202 includes first through fourth switches S1-S4. The first through fourth switches S1-S4 are differential switches. In an exemplary embodiment, the first through fourth switches S1-S4 are first through fourth n-channel metal-oxide semiconductor (NMOS) transistors, respectively. In another exemplary embodiment, the first through fourth switches S1-S4 are first through fourth bipolar-junction transistors (BJTs).

The first switch S1 has a drain terminal connected to the first summing node N1, and a gate terminal connected to the phase detector 104 for receiving the first ELV signal elv0. The second switch S2 has a drain terminal connected to the second summing node N2, and a gate terminal for receiving the first complementary ELV signal elvz0. The third switch S3 has a drain terminal connected to the first summing node N1, and a gate terminal connected to the phase detector 104 for receiving the second ELV signal elv1. The fourth switch S4 has a drain terminal connected to the second summing node N2, and a gate terminal for receiving the second complementary ELV signal elvz1. In an embodiment, the first through fourth switches S1-S4 are turned ON or turned OFF based on the first ELV signal elv0, the first complementary ELV signal elvz0, the second ELV signal elv1, and the second complementary ELV signal elvz1, respectively. Alternatively stated, based on the logic states of the first ELV signal elv0, the first complementary ELV signal elvz0, the second ELV signal elv1, and the second complementary ELV signal elvz1, the first and second current signals FCS1 and SCS1 are steered into or out of the first and second summing nodes N1 and N2, respectively.

The first current-source circuit 204 is connected between a power supply, such as a positive supply voltage VDD, and the first and second summing nodes N1 and N2. In an embodiment, the first current-source circuit 204 includes first and second current-sources CS1 and CS2. The first and second current-sources CS1 and CS2 may be implemented using p-channel metal-oxide semiconductor (PMOS) transistors. The first current-source CS1 is connected between the positive supply voltage VDD and the first summing node N1, and the second current-source CS2 is connected between the positive supply voltage VDD and the second summing node N2. The first current-source circuit 204 further includes the input node, i.e., the third node N3. Further, gate terminals of the first and second current-sources CS1 and CS2 are connected to the third node N3. The first current-source circuit 204 is further connected to the first CMFB amplifier circuit 212 at the third node N3 for receiving a CMFB control signal $V_{inCMFB}$ (i.e., an output signal from the first CMFB amplifier circuit 212). The first CMFB amplifier circuit 212 is implemented to prevent deviations in an output voltage Vout between the first and second summing nodes N1 and N2, which reduces the common mode induced frequency variations in the clock signal CLK. The first current-source circuit 204 generates the first and second current signals FCS1 and SCS1 that are steered into or out of at least one of the first and second summing nodes N1 and N2, respectively, based on the first and second ELV signals elv0 and elv1. The first current-source CS1 generates and provides the first current signal FCS1 to the first summing node N1, and the second current-source CS2 generates and provides the second current signal SCS1 to the second summing node N2.

The first RC circuit 206 includes a first resistor R1 and a first capacitor C1 that are connected in a series combination between the third node N3 and the positive supply voltage VDD. The first RC circuit 206 provides a stability of a CMFB loop. The CMFB loop is formed when the first CMFB amplifier circuit 212 is connected to the third node N3 for providing the CMFB control signal $V_{inCMFB}$ to the first current-source circuit 204.

The capacitor bank 208 includes the plurality of capacitors, of which second through fourth capacitors C2-C4 are shown. The second through fourth capacitors C2-C4 are connected in a combination such that the second capacitor C2 is connected between the first summing node N1 and the positive supply voltage VDD, the third capacitor C3 is connected between the second summing node N2 and the positive supply voltage VDD, and the fourth capacitor C4 is connected between the first and second summing nodes N1 and N2. In an embodiment, a capacitance of the second capacitor C2 is equal to a capacitance of the third capacitor C3.

The pair of transistors 210 include first and second transistors T1 and T2. The first and second transistors T1 and T2 have gate terminals connected to a biasing voltage source (not shown) for receiving a biasing voltage Vbias. Drain terminals of the first and second transistors T1 and T2 are connected to the source terminals of the first and third switches S1 and S3, respectively, and source terminals of the first and second transistors T1 and T2 are connected to a power supply, such as a negative supply voltage VSS. In an exemplary embodiment, the first and second transistors T1 and T2 are NMOS transistors.

The first CMFB amplifier circuit 212 includes a source degenerated pair of switches, which includes fifth through tenth switches S5-S10, second through fifth resistors R2-R5, and a third transistor T3. In an exemplary embodiment, the fifth and sixth switches S5 and S6 are PMOS transistors, and the seventh through tenth switches S7-S10 are NMOS transistors. Further, the second through fifth resistors R2-R5 are source degeneration resistors. The third transistor T3 has a gate terminal for receiving the biasing voltage Vbias, a drain terminal connected to the second through fifth resistors R2-R5, and a source terminal connected to the negative supply voltage VSS. In an embodiment, the first through third transistors T1-T3 have the same current density.

The fifth switch S5 has a source terminal connected to the positive supply voltage VDD, and a drain terminal connected to the third node N3. The sixth switch S6 has a source terminal connected to the positive supply voltage VDD, and a gate terminal connected to its drain terminal. The gate terminal of the sixth switch S6 is further connected to a gate terminal of the fifth switch S5. The seventh and eighth switches S7 and S8 have drain terminals connected to the drain terminal of the fifth switch S5, gate terminals for receiving a reference voltage signal VrefCM from a reference voltage source (not shown), and source terminals connected to the second and third resistors R2 and R3, respectively. The ninth and tenth switches S9 and S10 have drain terminals connected to the drain terminal of the sixth switch S6, gate terminals connected to the second and first summing nodes N2 and N1 for receiving first and second output voltages Voutp and Voutn, respectively, and source terminals connected to the fourth and fifth resistors R4 and R5, respectively. The first CMFB amplifier circuit 212 provides the CMFB control signal $V_{inCMFB}$ to the third node N3, to prevent deviations in the output voltage Vout (=Voutp−Voutn) between the first and second summing nodes N1 and N2, and reduce the common mode induced frequency variations at the oscillator output i.e., in the clock signal CLK.

In operation, and for the sake of ongoing discussion without limiting the scope of the invention, it is being assumed here that the first and second ELV signals elv0 and elv1 are at logic low state "0". Hence, the first and second complementary ELV signals evlz0 and elvz1 are at logic high state "1". Thus, when the first and third switches S1 and S3 receive the first and second ELV signals elv0 and elv1 at logic low state "0", the first and third switches S1 and S3 are turned OFF. Similarly, when the second and fourth switches S2 and S4 receive the first and second complementary ELV signals evlz0 and elvz1 at logic high state "1", the second and fourth switches S2 and S4 are turned ON. In such a scenario, the first current-source CS1 steers the first current signal FCS1 into the first summing node N1, and then through the capacitor bank 208, whereas the second current-source CS2 steers the second current signal SCS1 out of the second summing node N2 through the second and fourth switches S2 and S4. When the first current-source CS1 steers the first current signal FCS1 into the first summing node N1, a portion of the first current signal FCS1 steers from the first summing node N1 to the second summing node N2 by way of the fourth capacitor C4, thereby increasing a voltage level of the output voltage Vout across the fourth capacitor C4. When the portion of the first current signal FCS1 steers through the fourth capacitor C4, the fourth capacitor C4 produces the linearly varying differential output voltage signal that is equal to the output voltage Vout (=Voutp−Voutn). In an embodiment, the output voltage Vout is provided as the first control signal FCS2 to the oscillator 108 for controlling a frequency of the clock signal CLK.

A person having ordinary skill in the art would understand that the scope of the present invention is not limited to the first or second ELV signal elv0 or elv1 having logic low state "0". The first or second ELV signal elv0 or elv1 may have logic low state "0", logic high state "1", or a combination thereof without limiting the scope of the present invention.

Figure 3B:
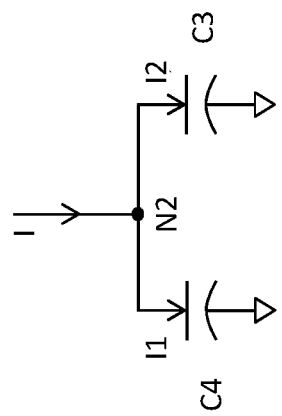
FIGS. 3A and 3B, collectively, illustrate capacitors that are connected at a summing node of FIG. 2, in accordance with an embodiment of the present invention.
Figure 3A:
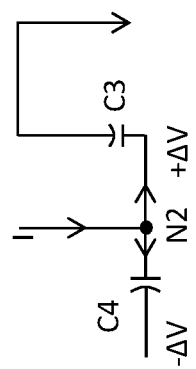

Referring now to FIGS. 3A and 3B, the third and fourth capacitors C3 and C4 connected at the second summing node N2 of FIG. 2 in accordance with an embodiment of the present invention are shown. In an embodiment, a current I, i.e., the second current signal SCS1 generated by the first current-source circuit 204 flows into or out of the second summing node N2 based on the first and second ELV signals elv0 and elv1. The current I separates into first and second currents I1 and I2. The first current I1 flows through the fourth capacitor C4, and the second current I2 flows through the third capacitor C3. The current I1 flowing through the fourth capacitor C4 is given by equation (1):

$$I1 = \frac{I \times 2Cc4}{2Cc4 + Cc3} \quad (1)$$

where, Cc4 is a capacitance of the fourth capacitor C4, Cc3 is a capacitance of the third capacitor C3, and 2Cc4 is an effective capacitance of the fourth capacitor C4.

Therefore, a rate of change of voltage across the fourth capacitor C4 is given by equation (2):

$$\frac{dV}{dt} = \frac{I1}{C4} = \frac{I}{Cc4 + \frac{Cc3}{2}} = \frac{I}{Ctotal} \quad (2)$$

where, Ctotal is a total capacitance of the integrator circuit 112. Based on equation (2), the total capacitance of the integrator circuit 112 is given by equation (3):

$$Ctotal = Cc4 + \frac{Cc3}{2} \quad (3)$$

However, when both the third and fourth capacitors C3 and C4 are connected to the positive supply voltage VDD, then the total capacitance of the integrator circuit 112 is given by equation (4):

$$Ctotal = \frac{Cc4}{4} + \frac{Cc3}{2} \quad (4)$$

Therefore, a capacitance of the fourth capacitor C4 when it is connected between the first and second summing nodes N1 and N2 is twice the capacitance when the fourth capacitor C4 is connected to one of the positive and negative supply voltages VDD and VSS. Hence, the fourth capacitor C4, when connected between the first and second summing nodes N1 and N2, will require half the area in comparison to a scenario when the fourth capacitor C4 is connected to the one of the positive and negative supply voltages VDD and VSS. In an alternate embodiment, the integrator circuit 112 can be directly connected to the positive supply voltage VDD to provide the desired power supply rejection.

Figure 4:
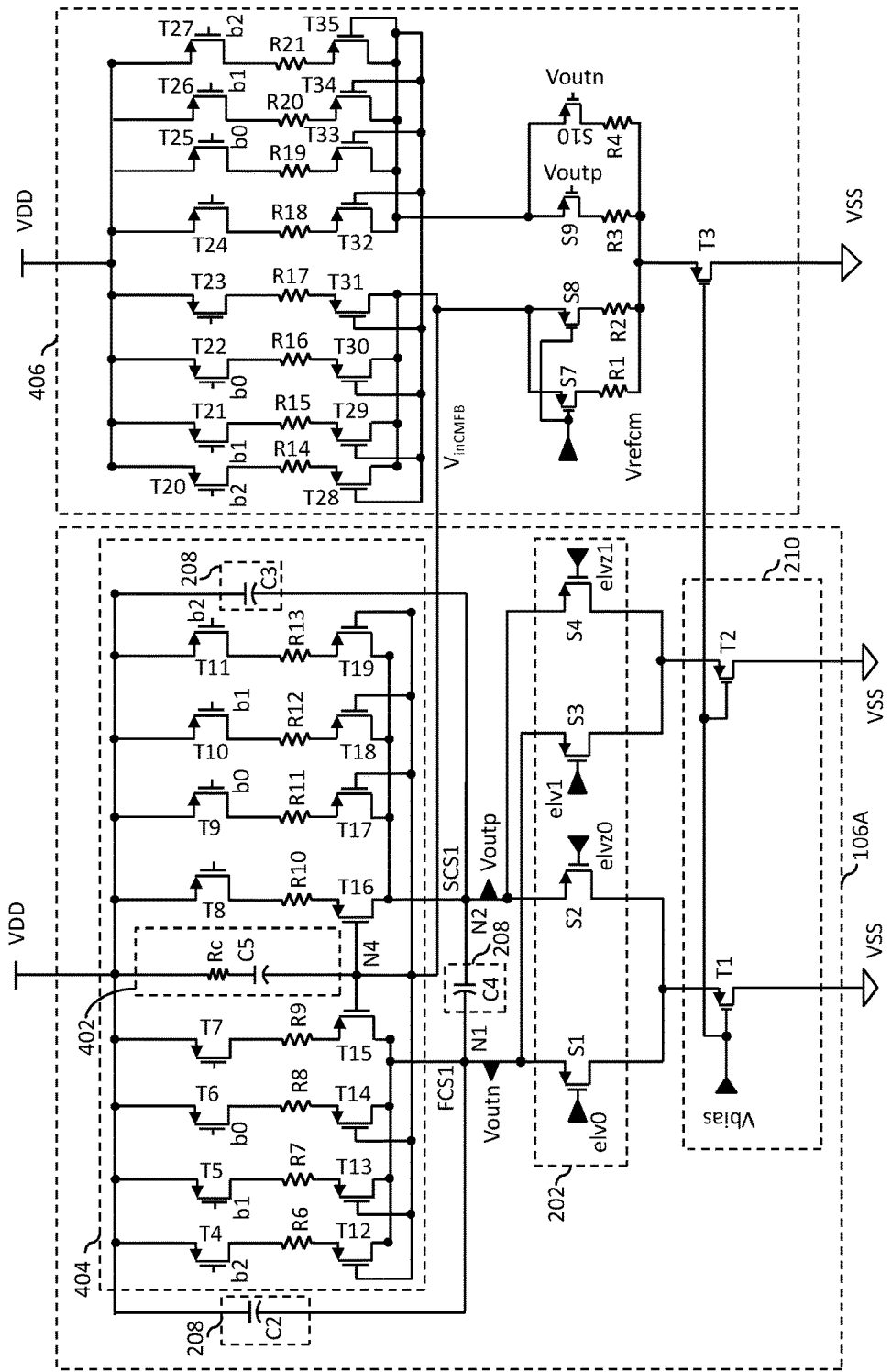
FIG. 4 is a circuit diagram of the integral path of the CDR circuit of FIG. 1, in accordance with another embodiment of the present invention.

Referring now to FIG. 4, a circuit diagram of the integral path 106A of the CDR circuit 100 of FIG. 1 in accordance with another embodiment of the present invention is shown. The integral path 106A includes the set of switches 202, the capacitor bank 208, the pair of transistors 210, a second RC circuit 402, and a second current-source circuit 404. The integral path 106A is connected to a second CMFB amplifier circuit 406.

In the embodiment, the second current-source circuit 404 includes sixth through thirteenth resistors R6-R13, fourth through eleventh transistors T4-T11, and twelfth through nineteenth transistors T12-T19. In an exemplary embodiment, each of the fourth through eleventh transistors T4-T11 and the twelfth through nineteenth transistors T12-T19 operates as a switch and may be implemented using PMOS transistors. Further, with connections of the sixth through thirteenth resistors R6-R13, the fourth through eleventh transistors T4-T11, and the twelfth through nineteenth transistors T12-T19 as shown in FIG. 4, the second current-source circuit 404 controls the generation of the first and second current signals FCS1 and SCS1. For example, the generation of the first current signal FCS1 is controlled based on first through third current programming bits b0-b2 generated by a current programming bits (CPB) generator circuit (not shown). The CPB generator circuit is connected to gate terminals of the fourth through sixth transistors T4-T6, and provides the third, second, and first current programming bits b2, b1, and b0, respectively. Based on the third, second, and first current programming bits b2, b1, and b0, the fourth through sixth transistors T4-T6 are turned ON or turned OFF, respectively, and which in turn prevents the variations in the first current signal FCS1. Similarly, the generation of the second current signal SCS1 is controlled based on the first through third current programming bits b0-b2.

In an embodiment, the second CMFB amplifier circuit 406 is connected to an input node of the second current-source circuit 404, for example, a fourth node N4, as shown. The second CMFB amplifier circuit 406 includes the first through fourth resistors R1-R4, the third transistor T3, seventh through tenth switches S7-S10, fourteenth through twenty-first resistors R14-R21, twentieth through twenty-seventh transistors T20-T27, and twenty-eighth through thirty-fifth transistors T28-T35. With exemplary connections of the fourteenth through twenty-first resistors R14-R21, the twentieth through twenty-seventh transistors T20-T27, and the twenty-eighth through thirty-fifth transistors T28-T35 as shown in FIG. 4, the second CMFB amplifier circuit 406 controls the generation of the CMFB control signal $V_{inCMFB}$. It will be apparent to a person skilled in the art that the integral path 106A connected with the second CMFB amplifier circuit 406 is functionally similar to the integral path 106A that is connected with the first CMFB amplifier circuit 212.

Figure 5:
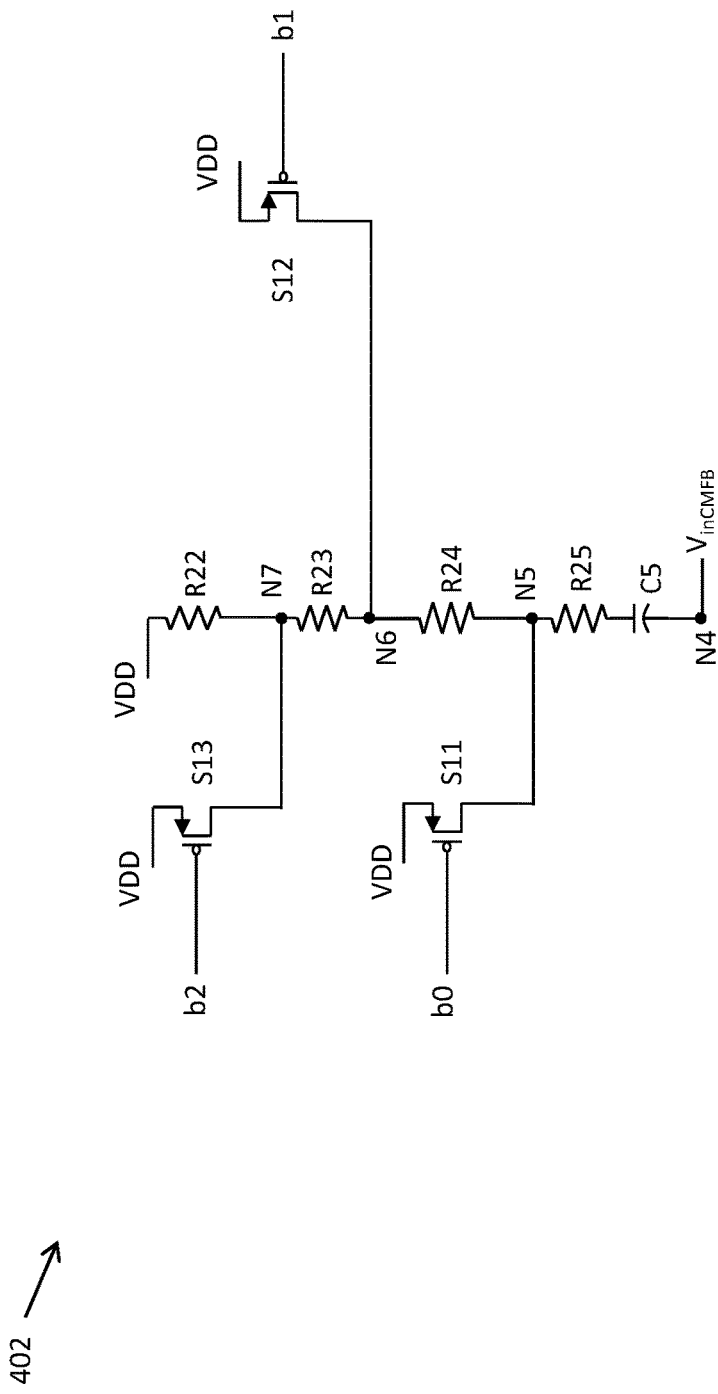
FIG. 5 is a circuit diagram of a resistive-capacitive (RC) circuit of the integral path of the CDR circuit of FIG. 4, in accordance with an embodiment of the present invention.

Referring now to FIG. 5, a circuit diagram of the second RC circuit 402 of FIG. 4 in accordance with an embodiment of the present invention is shown. The second RC circuit 402 includes a fifth capacitor C5, eleventh through thirteenth switches S11-S13, and twenty-second through twenty-fifth resistors R22-R25. The second RC circuit 402 receives the first through third current programming bits b0, b1, and b2. The second RC circuit 402 further includes the fourth node N4 and fifth through seventh nodes N5-N7.

In an embodiment, the eleventh switch S11 has a source terminal for receiving the positive supply voltage VDD, a drain terminal connected to the fifth node N5, and a gate terminal for receiving the first current programming bit b0. The twelfth switch S12 has a source terminal connected to the positive supply voltage VDD, a drain terminal connected to the sixth node N6, and a gate terminal for receiving the second current programming bit b1. The thirteenth switch S13 has a source terminal connected to the positive supply voltage VDD, a drain terminal connected to the seventh node N7, and a gate terminal for receiving the third current programming bit b2. The twenty-second resistor R22 is connected between the positive supply voltage VDD and the seventh node N7. The twenty-third resistor R23 is connected between the sixth and seventh nodes N6 and N7. The twenty-fourth resistor R24 is connected between the fifth and sixth nodes N5 and N6. The twenty-fifth resistor R25 is connected to the fifth capacitor C5 and the fifth node N5. The fourth node N4 receives the CMFB control signal $V_{inCMFB}$ from the second CMFB amplifier circuit 406. In an embodiment, a total resistance of the second RC circuit 402 is controlled based on the first through third current programming bits b0-b2 that are provided to the gate terminals of the eleventh through thirteenth switches S11-S13, respectively. By controlling the total resistance, the second RC circuit 402 provides the stability to the CMFB loop that is formed when the second CMFB amplifier circuit 406 is connected to the second current-source circuit 404 at the fourth node N4.

The CDR circuit 100 employs the first and second ELV signals elv0 and elv1 for controlling the frequency of the clock signal CLK. Thus, no external signals are required to control the frequency. Also, as the integral and proportional paths 106A and 106B of the PI controller 106 are split, the requirement of an additional capacitor for maintaining the stability is eliminated. The charge pump 110 is a differential charge pump that provides improved current matching characteristics as compared to a single-ended charge pump. Further, due to the arrangement of the second through fourth capacitors C2-C4, the area required by the CDR circuit 100 is less as compared to conventional CDR circuits. Further, a CMFB amplifier circuit, such as the first and second CMFB amplifier circuits 212 and 406 provides the CMFB control signal $V_{inCMFB}$ as an input to the first and second current-source circuits 204 and 404, which reduces the deviations in the output voltage Vout (=Voutp−Voutn) from its ideal value. Further, the usage of the first through third current programming bits b0-b2 maintains the total resistance of the second RC circuit 402, and hence, minimizes leakage in the CDR circuit 100.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A clock and data recovery (CDR) circuit, comprising:
   a sampler for receiving a data signal and a clock signal, and generating first, second, and third sampled signals;
   a phase detector that is connected to the sampler for receiving the first, second, and third sampled signals, and generating first and second early-late vote (ELV) signals; and
   a proportional-integral (PI) controller that is connected to the phase detector, the PI controller comprising:
      a charge pump that receives the first and second ELV signals, and steers a current signal into or out of one of summing nodes based on the first and second ELV signals;
      a resistive-capacitive (RC) circuit that is connected to a current-source circuit of the charge pump, the RC circuit providing a stability of a common-mode feedback (CMFB) loop when a CMFB amplifier circuit is connected to the current-source circuit;
      an integrator circuit that receives the current signal from one of the summing nodes, and generates a first control signal;
      a proportional circuit that receives the first and second ELV signals, and generates a second control signal; and
      an oscillator that is connected to the integrator and proportional circuits for receiving the first and second control signals, respectively, and generating the clock signal.

2. The CDR circuit of claim 1, further comprising a common-mode feedback (CMFB) amplifier circuit that is connected to the charge pump and a reference voltage source, for receiving the first control signal and a reference voltage signal, respectively, and generating a CMFB control signal.

3. The CDR circuit of claim 2, wherein the charge pump includes a current-source circuit for receiving the CMFB control signal, and generates the current signal that is steered into or out of one of the summing nodes based on the first and second ELV signals.

4. The CDR circuit of claim 1, wherein the charge pump includes a set of switches that are connected to the phase detector for receiving the first and second ELV signals, and steers the current signal into or out of one of the summing nodes.

5. The CDR circuit of claim 1, wherein the charge pump includes first through fourth differential pair of switches such that the first and second switches share first and second summing nodes of the summing nodes with the third and fourth switches, respectively, wherein the first and third switches receive the first and second ELV signals, respectively, and the second and fourth switches receive complementary versions of the first and second ELV signals, respectively, and wherein the first through fourth switches are turned ON or turned OFF based on the first and second ELV signals.

6. The CDR circuit of claim 1, wherein the CMFB amplifier circuit includes a source degenerated pair of switches, wherein the source degenerated pair of switches includes first through fourth switches to control frequency variations in the clock signal, and wherein the first and second switches are connected to a reference voltage source and the third and fourth switches are connected to the summing nodes.

7. The CDR circuit of claim 1, wherein the integrator circuit includes a capacitor bank, wherein the capacitor bank includes a plurality of capacitors including first through third capacitors that are connected in a combination such that the third capacitor is connected across first and second summing nodes of the summing nodes, wherein the first and second capacitors are connected between the first and second summing nodes and a power supply, respectively, and wherein a first capacitance of the first capacitor is equal to a second capacitance of the second capacitor.

* * * * *